(12) United States Patent
Kirby et al.

(10) Patent No.: US 11,522,118 B2
(45) Date of Patent: Dec. 6, 2022

(54) SUPERCONDUCTOR STRUCTURE WITH NORMAL METAL CONNECTION TO A RESISTOR AND METHOD OF MAKING THE SAME

(71) Applicants: Christopher F. Kirby, Gambrills, MD (US); Michael Rennie, Ashland, VA (US); Daniel J. O'Donnell, Linthicum, MD (US); Aurelius L. Graninger, Sykesville, MD (US); Aaron A. Pesetski, Gambrills, MD (US)

(72) Inventors: Christopher F. Kirby, Gambrills, MD (US); Michael Rennie, Ashland, VA (US); Daniel J. O'Donnell, Linthicum, MD (US); Aurelius L. Graninger, Sykesville, MD (US); Aaron A. Pesetski, Gambrills, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 429 days.

(21) Appl. No.: 16/738,790

(22) Filed: Jan. 9, 2020

(65) Prior Publication Data
US 2021/0217949 A1 Jul. 15, 2021

(51) Int. Cl.
*H01L 21/00* (2006.01)
*H01L 39/24* (2006.01)
(Continued)

(52) U.S. Cl.
CPC .......... *H01L 39/24* (2013.01); *H01L 23/5228* (2013.01); *H01L 23/53242* (2013.01)

(58) Field of Classification Search
CPC ................ H01L 39/24; H01L 23/5228; H01L 23/53242
See application file for complete search history.

(56) References Cited

U.S. PATENT DOCUMENTS 5,780,314 A    7/1998  Chan
5,897,367 A *  4/1999  Kerber .................... H01L 27/18
                                                          257/30
(Continued)

FOREIGN PATENT DOCUMENTS

AU    2017345049 B2 *  2/2020  ........... H01L 39/025
CA       3033343 A1 *  4/2018  ........... H01L 39/025
(Continued)

OTHER PUBLICATIONS

Korean Office Action for Application No. 10-2020-7007653 dated Feb. 21, 2021.
(Continued)

*Primary Examiner* — Laura M Menz
(74) *Attorney, Agent, or Firm* — Tarolli, Sundheim, Covell & Tummino LLP

(57) ABSTRACT

A method of forming a superconductor structure is disclosed. The method comprises forming a superconductor line in a first dielectric layer, forming a resistor with an end coupled to an end of the superconductor line, and forming a second dielectric layer overlying the resistor. The method further comprises etching a tapered opening through the second dielectric layer to the resistor, and performing a contact material fill with a normal metal material to fill the tapered opening and form a normal metal connector coupled to the resistor.

20 Claims, 7 Drawing Sheets

(51) Int. Cl.
  *H01L 23/522* (2006.01)
  *H01L 23/532* (2006.01)

(56) References Cited

U.S. PATENT DOCUMENTS

| | | | |
|---|---|---|---|
| 6,246,583 B1 | 6/2001 | Cronin et al. | |
| 6,303,423 B1 | 10/2001 | Lin | |
| 6,528,732 B1 | 3/2003 | Okubora et al. | |
| 7,382,138 B1 | 6/2008 | Umans | |
| 8,508,280 B2* | 8/2013 | Naaman | H03K 3/38 333/32 |
| 9,153,863 B2 | 10/2015 | Nair et al. | |
| 9,768,371 B2* | 9/2017 | Ladizinsky | H01L 39/2406 |
| 9,780,285 B1* | 10/2017 | Kirby | H01L 39/025 |
| 9,871,034 B1 | 1/2018 | Or-Bach et al. | |
| 10,003,005 B2* | 6/2018 | Kirby | H01L 39/2493 |
| 10,158,062 B2* | 12/2018 | Kirby | H01L 39/025 |
| 10,229,864 B1 | 3/2019 | Loney et al. | |
| 10,276,504 B2* | 4/2019 | Luu | H01L 21/76877 |
| 10,727,162 B2 | 7/2020 | Loney et al. | |
| 10,950,778 B2* | 3/2021 | Graninger | G01R 31/2884 |
| 2009/0102580 A1* | 4/2009 | Uchaykin | H05K 1/0224 333/185 |
| 2009/0267635 A1* | 10/2009 | Herr | H03K 3/38 326/4 |
| 2009/0322374 A1* | 12/2009 | Przybysz | G06N 10/00 326/5 |
| 2010/0026538 A1* | 2/2010 | Herr | H03M 3/422 341/143 |
| 2011/0089405 A1* | 4/2011 | Ladizinsky | B82Y 10/00 257/31 |
| 2011/0309513 A1 | 12/2011 | Biegelsen et al. | |
| 2012/0063097 A1 | 3/2012 | Reza et al. | |
| 2012/0217625 A1 | 8/2012 | Mohan et al. | |
| 2015/0119253 A1* | 4/2015 | Yohannes | H01L 27/18 505/190 |
| 2016/0148112 A1* | 5/2016 | Kwon | G06N 10/00 257/31 |
| 2016/0322689 A1* | 11/2016 | Herr | H03K 3/38 |
| 2017/0162513 A1* | 6/2017 | Kelliher | H01L 21/76891 |
| 2018/0062061 A1* | 3/2018 | Kirby | H01L 39/2493 |
| 2018/0212134 A1* | 7/2018 | Sherman | H01L 23/53285 |
| 2018/0247974 A1* | 8/2018 | Oliver | H01L 39/045 |
| 2018/0301614 A1* | 10/2018 | Kirby | H01L 39/2493 |
| 2019/0058005 A1* | 2/2019 | Pesetski | H01L 23/367 |
| 2020/0072772 A1* | 3/2020 | Graninger | H01L 27/18 |
| 2020/0137885 A1 | 4/2020 | Flowers et al. | |
| 2020/0152540 A1 | 5/2020 | Nah et al. | |
| 2020/0203245 A1 | 6/2020 | Hathaway et al. | |
| 2021/0217949 A1* | 7/2021 | Kirby | H01L 27/18 |
| 2021/0232710 A1* | 7/2021 | Sherman | G06F 21/72 |

FOREIGN PATENT DOCUMENTS

| | | | | |
|---|---|---|---|---|
| EP | 0883178 | A2 | 12/1998 | |
| EP | 3485522 | A2 * | 5/2019 | H01L 39/025 |
| EP | 3485522 | B1 * | 10/2020 | H01L 39/025 |
| JP | 2001330328 | A | 11/2001 | |
| JP | 2003188307 | A | 7/2003 | |
| JP | 2003273520 | A | 9/2003 | |
| JP | 2004152810 | A | 5/2004 | |
| JP | 2004158865 | A | 6/2004 | |
| JP | 2004349537 | A | 12/2004 | |
| JP | 2008172223 | A | 7/2008 | |
| JP | 2012519379 | A | 8/2021 | |
| KR | 20000021171 | U | 12/2000 | |
| KR | 20120018713 | A | 3/2012 | |
| KR | 20140070655 | A | 6/2014 | |
| KR | 20160031408 | A | 3/2016 | |
| KR | 20160122177 | A | 10/2016 | |
| WO | 2011109595 | A1 | 9/2011 | |
| WO | WO-2018075116 | A2 * | 4/2018 | H01L 39/025 |
| WO | WO-2021141691 | A * | 7/2021 | H01L 23/5228 |
| WO | WO-2021141691 | A1 * | 7/2021 | H01L 23/5228 |

OTHER PUBLICATIONS

Japanese Office Action for Application No. 2020-508606 dated Feb. 9, 2021.
Final Office Action for U.S. Appl. No. 16/227,965 dated Dec. 18, 2020.
Australian Examination Report for Application No. 2018318000 dated Jul. 9, 2020.
F. C. Wellstood, C. Urbina and J. Clarke, "Hot electron effect in the DC Squid," in IEEE Transactions on Magnetics, vol. 25, No. 2, pp. 1001-1004, Mar. 1989, doi: 10.1109/20.92457.
Australian Examination Report for Application No. 2018362082 dated Jul. 23, 2020.
Non Final Office Action for U.S. Appl. No. 16/227,965 dated Sep. 3, 2020.
Kerber, et al.: "Fabrication of Submicrometer High Current Density Junctions"; IEEE Transactions on App Li Ed Superconductivity, IEEE Service Center, Los Alamitos, CA, US, vol. 19, No. 3, Jun. 1, 2009 (Jun. 1, 2009), pp. 159-166, XP011257471, ISSN: 1051-8223 paragraph [0002]; figure 1.
International Search Report issued for corresponding PCT/US2020/061691; dated Jun. 11, 2021.
Bumble, et al.: "Submicrometer Nb/Al-AlOx/Nb Integrated Circuit Fabrication Process for Quantum Computing Applications"; IEEE Transactions on Applied Superconductivity, vol. 19, No. 3, Jun. 2009; pp. 226-229.
Tolpygo, et al.: "Properties of Unshunted and Resistively Shunted Nb/AlOx-Al/Nb Josephson Junctions With Critical Current Densities From 0.1 to 1 mA/μm2"; IEEE Transactions on Applied Superconductivity, vol. 27, No. 4, Jun. 2017; pp. 1-15.
Wellstood, et al. "Hot electron effect in the DC Squid" IEEE Transactions on Magnetics, U.S., IEEE, Mar. 1989, vol. 25, Issue 2, pp. 1001-1004, DOI: 10.1109/20.92457.
A. Arbouet, et al. Nonequilibrium Physics at Short Time Scales, 2004, pp. 357-358.
European Office Action for Application No. 18 782 271.36-1211 dated May 11, 2021.
Canadian Office Action for Application No. 3071687 dated Apr. 13, 2021.
Korean Office Action for Application No. 1020207006727 dated Apr. 28, 2021.
Japanese Office Action for Application No. 2020-508459 dated Apr. 27, 2021.

* cited by examiner

US 11,522,118 B2

SUPERCONDUCTOR STRUCTURE WITH NORMAL METAL CONNECTION TO A RESISTOR AND METHOD OF MAKING THE SAME

GOVERNMENT INTEREST

The invention was made under Government Contract Number 30069413. Therefore, the US Government has rights to the invention as specified in that contract.

TECHNICAL FIELD

The present invention relates generally to superconductors, and more particularly to a superconductor structure with a normal metal connection to a resistor and a method of making the same.

BACKGROUND

Superconducting circuits are one of the leading technologies proposed for a wide variety of computing and electronics applications, due to their advantages over traditional semiconducting circuits with respect to power consumption and speed. They are operated at temperatures <100 kelvin. Efforts in fabrication of superconducting devices have mostly been confined to university or government research labs, with little published on the mass producing of superconducting devices. Therefore, many of the methods used to fabricate superconducting devices in these laboratories utilize processes or equipment incapable of rapid, consistent fabrication. Recently there has been a movement to mass production of superconducting circuits utilizing similar techniques as those utilized in conventional semiconductor processes.

One well-known semiconductor process is the formation of contacts and conductive lines in a multi-level interconnect stack to couple devices to one another over different layers of an integrated circuit. During the fabrication of superconducting circuits, via/trench structures are patterned, etched, filled with metal (e.g., niobium, tantalum, aluminum), then polished back using a chemical mechanical polishing (CMP) process. The next level dielectric is then deposited, and the sequence begins again, building up a multi-level interconnect stack.

In a conventional metal interconnect for microelectronic devices, via openings to underlying metals are cleaned, typically with a physical sputtering of the metal surface at the bottom of the via opening. This can result in re-deposition of the sputtered metal along the sidewalls. However, since the goal of conventional interconnects is to provide a continuous, low resistance electrical path, any re-deposited material has little to no impact on the conductivity of the metal filled in the via. Where the goal is to provide resistors in a superconductor structure, re-deposition of superconductor material can compromise the resistance by creating a shorting path.

SUMMARY

In one example, a method of forming a superconductor structure is disclosed. The method comprises forming a superconductor line in a first dielectric layer, forming a resistor with an end coupled to an end of the superconductor line, and forming a second dielectric layer overlying the resistor. The method further comprises etching a tapered opening through the second dielectric layer to the resistor, and performing a contact material fill with a normal metal material to fill the tapered opening and form a normal metal connector coupled to the resistor.

In yet another example, a superconductor structure is disclosed. The superconductor structure comprises a first dielectric layer overlying a substrate, a superconductor line residing within the first dielectric layer, a second dielectric layer overlying the first dielectric layer, and a third dielectric layer overlying the second dielectric layer. A resistor with a resistor contact end extends through the second dielectric layer to an end of the superconductor line, and a connecting portion connects to the resistor contact end and resides within the third dielectric layer. A tapered opening extends through the third dielectric layer to the resistor, and a normal metal connector connects to the resistor through the tapered opening.

DETAILED DESCRIPTION

The present disclosure is directed to a superconductor structure with a normal metal connection to a resistor and a method of making the same. A requirement of the normal metal connection is that it be highly conductive, yet not superconducting at the intended operating temperature of the integrated circuit. In one example, a non-superconducting (normal metal) contact is connected to an inlay precision resistor used in superconducting niobium based interconnects employing a planarized damascene process flow. As used herein, the term damascene can refer to either a single damascene process or structure, or a dual damascene process or structure. In another example, the normal metal contact is connected between ends of the resistor and is configured to remove heat from the resistor. Alternatively, the normal metal contact can be connected to an end of the resistor and be configured as a ground terminal connectable to a ground plane and/or a thermal contact to remove heat from the resistor. In this particular configuration, the resistor can be configured as either a two terminal device or a three terminal device.

The current methods of incorporating resistors into a superconducting process flow create large topography which limits the scalability due to lithographic challenges (feature size) and the ability to stack multiple levels of interconnect above the resistor (limited to 3-4). The problem is that existing methods for resistor fabrication do not provide or allow for the implementation of a normal metal contact in addition to the superconducting contacts. The present disclosure provides for formation of inlayed resistors compatible with a fully planarized process flow, such as damascene metal wiring enabling more than 5 levels to be stacked above the resistor level.

Figure 1:
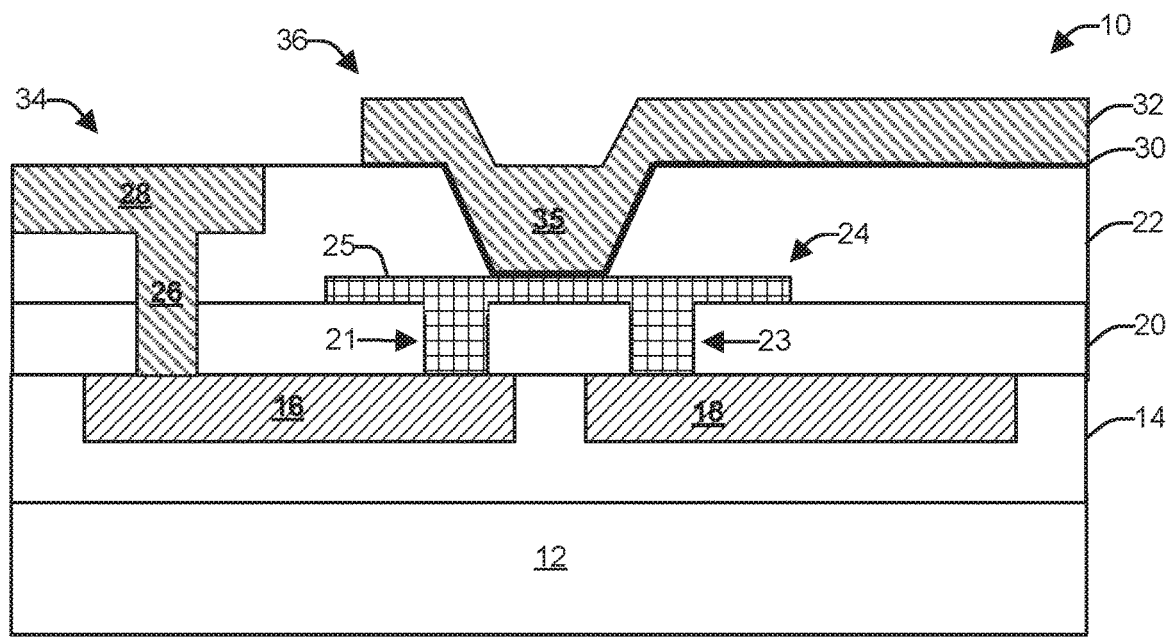
FIG. 1 illustrates a cross-sectional view of an example of a superconductor structure with a three terminal resistor.

FIG. 1 illustrates a cross-sectional view of an example superconductor structure 10 that includes a normal metal connector coupled to a mid-portion of a resistor in a three terminal device configuration. The superconductor structure 10 can be a superconducting interconnect structure. The superconductor structure 10 includes a first dielectric layer 14 overlying a substrate 12. The substrate 12 can be formed of silicon, glass, or other substrate material. A second dielectric layer 20 overlies the first dielectric layer 14, and a third dielectric layer 22 overlies the second dielectric layer 20. In one example, one or more of the first, the second, and the third dielectric layers 14, 20 and 22 can be formed of a low temperature dielectric material (e.g., TEOS) that can be employed in low temperatures (e.g., less than or equal to 160 degrees Celsius) typically utilized in the formation of superconducting devices. In another example, one or more of the first, the second, and the third dielectric layers 14, 20 and 22 can be formed of a higher temperature dielectric material (e.g., silicon nitride). In yet another example, the one or more of the first, the second, and the third dielectric layers 14, 20 and 22 can be formed of a combination of higher lower and higher temperature dielectric material. A first superconductor line 16 and a second superconductor line 18 are disposed in the first dielectric layer 14 having top surfaces being flush with a bottom surface of the second dielectric layer 20.

A resistor 24 has a general T-shape and includes a first resistor contact 21 in contact with an end of the first superconductor line 16 and a second resistor contact 23 in contact with an end of the second superconducting line 18. A connecting portion 25 of the resistor 24 couples the first resistor contact 21 and the second resistor contact 23 together and provides for the substantial portion of the resistance of the resistor 24. The connecting portion 25 extends past both the first resistor contact 21 and the second resistor contact 23. The first resistor contact 21 and the second resistor contact 23 extend through the second dielectric layer 20 from the bottom surface of the second dielectric layer 20 to the top surface of the second dielectric layer 20. The connecting portion 25 of the resistor 24 is disposed over the top surface of the second dielectric layer 20 within a bottom surface portion of the third dielectric layer 22.

A damascene superconductor connector 34 is connected to an end of the first superconductor line 16 opposite the end connected to the first resistor contact 21. The damascene superconductor connector 34 includes a superconductor contact 26 and a superconductor line 28. Each of the first and second superconductor lines 16 and 18, and the damascene superconductor connector 34 are formed of a superconducting material, such as niobium, aluminum or tantalum. The resistor 24 can be formed of a resistive material, such as titanium tungsten (TiW), molybdenum or molybdenum nitride (Mo, MoN), or palladium gold (PdAu).

A normal metal connector 36 overlies a portion of the third dielectric layer 22 and fills a tapered opening 35 in the third dielectric layer 22 to connect with a mid-portion of the resistor 24. The normal metal connector 36 includes a normal metal liner 30 and a normal metal conductive line 32. The normal metal liner 30 can be formed from a thin titanium layer that adheres to the resistor 24 and the normal metal conductive line 32 can be formed from a normal metal, such as gold. The normal metal connector 36 can be configured to provide a third connection to the resistor 24 to provide an electrical connection and/or remove heat from the resistor 24.

Figure 2:
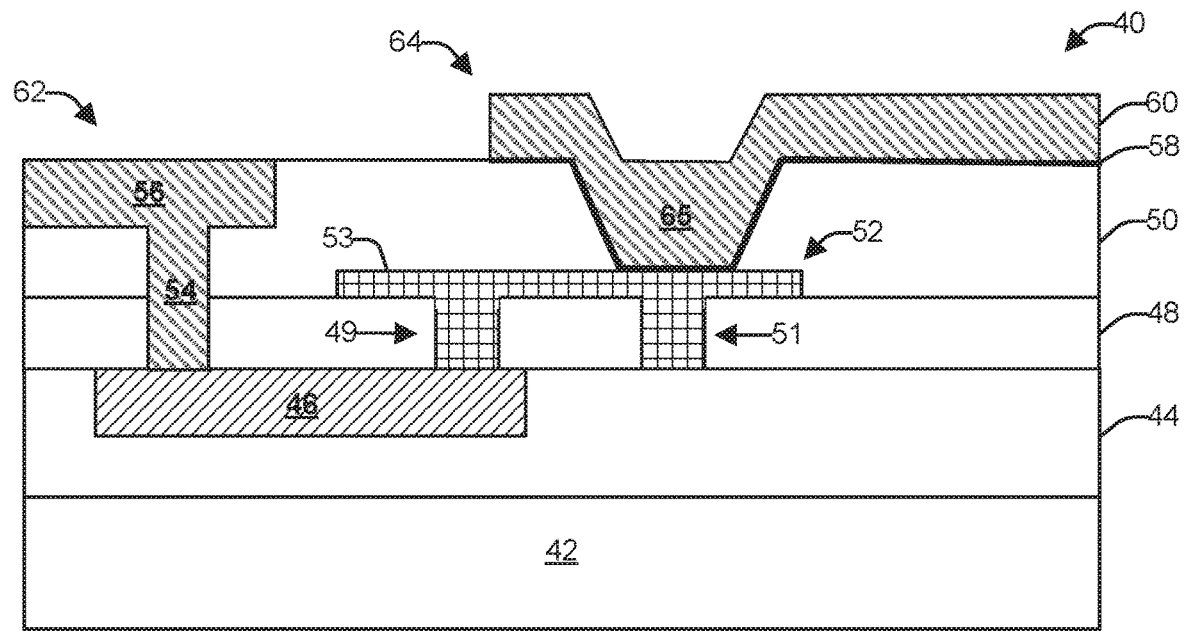
FIG. 2 illustrates a cross-sectional view of another example of a superconductor structure with a two terminal resistor.

FIG. 2 illustrates a cross-sectional view of an example superconductor structure 40 that includes a normal metal connector coupled to an end-portion of a resistor in a two terminal device configuration. In this example, the normal metal connector can be connected to or form part of a ground plane. The superconductor structure 40 can be a superconducting interconnect structure. The superconductor structure 40 includes a first dielectric layer 44 overlying a substrate 42. A second dielectric layer 48 overlies the first dielectric layer 44, and a third dielectric layer 50 overlies the second dielectric layer 48. One or more of the first, the second, and the third dielectric layers 44, 48 and 50 can be formed of a low temperature dielectric material (e.g., TEOS) that can be employed in low temperatures (e.g., less than or equal to 160 degrees Celsius) typically utilized in the formation of superconducting devices and/or higher temperature dielectric materials (e.g., silicon nitride) or a combination of both low temperature and higher temperature dielectric materials. A single superconductor line 46 is disposed in the first dielectric layer 44 having a top surface that is flush with a bottom surface of the second dielectric layer 48.

A resistor 52 has a general T-shape and includes a first resistor contact 49 in contact with an end of the single superconductor line 46 and a second resistor contact 51

(optional). A connecting portion 53 of the resistor 52 couples the first resistor contact 49 and the second resistor contact 51 together and provides for the substantial portion of the resistance of the resistor 52. The connecting portion 53 extends past both the first resistor contact 49 and the second resistor contact 51. The first resistor contact 49 and the second resistor contact 51 extend through the second dielectric layer 48 from the bottom surface of the second dielectric layer 48 to the top surface of the second dielectric layer 48. The connecting portion 53 of the resistor 52 is disposed over the top surface of the second dielectric layer 48 within a bottom surface portion of the third dielectric layer 50. In another example, the superconductor structure 40 includes a three terminal resistor with the second resistor contact 51 being coupled to a second superconductor line as shown in FIG. 1.

A damascene superconductor connector 62 is connected to an end of the single superconductor line 46 opposite the end connected to the first resistor contact 49. The damascene superconductor connector 62 includes a superconductor contact 54 and a superconductor line 56. Each of the first superconductor lines 46, and the damascene superconductor connector 62 are formed of a superconducting material, such as niobium, aluminum or tantalum. The resistor 52 can be formed of a resistive material, such as titanium tungsten (TiW), molybdenum or molybdenum nitride (Mo, MoN), or palladium gold (PdAu).

A normal metal connector 64 overlies a portion of the third dielectric layer 50 and fills a tapered opening 65 in the third dielectric layer 50 to connect with an end-portion of the resistor 52. The normal metal connector 64 includes a normal metal liner 58 and a normal metal conductive line 60. The normal metal liner 58 can be formed from a thin titanium layer that adheres to the resistor 52 and the normal metal conductive line 60 can be formed from a normal metal, such as gold. The normal metal connector 64 can be configured to provide an electrical connections, such as a ground connection to the resistor 52.

Turning now to FIGS. 3-17, fabrication is discussed relative to the formation of the superconductor structure of FIG. 1. It is to be appreciated that the present example is discussed with respect to a process flow that forms a resistive structure between superconducting lines as shown in FIG. 1 with a normal metal connector coupled to a mid-portion of a resistor, but could be employed to provide a structure as illustrated in FIG. 2 by moving the normal metal connector to be aligned with a connection point at an end-portion of the resistor, and optionally eliminating the second superconductor line and/or the second resistor contact.

Figure 3:
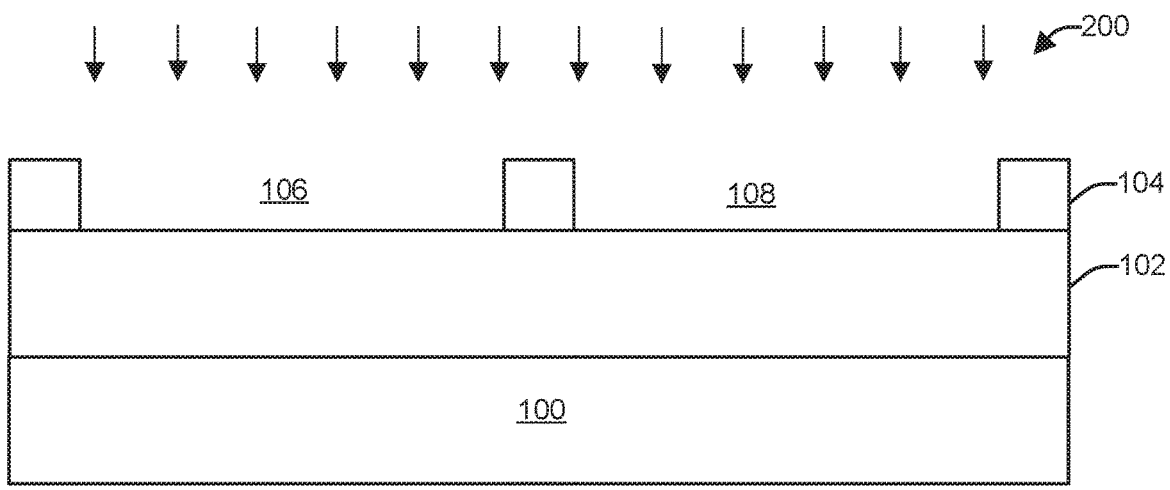
FIG. 3 illustrates a schematic cross-sectional view of a superconductor structure after a photoresist material layer has been deposited and patterned, and while undergoing an etch process.

FIG. 3 illustrates a cross-sectional view of a superconductor structure in its early stages of fabrication. The superconductor structure includes a first dielectric layer 102 overlying an underlying substrate 100. The underlying substrate 100 can be, for example, a silicon or glass wafer that provides mechanical support for the first dielectric layer 102 and subsequent overlying layers. Any suitable technique for forming the first dielectric layer 102 may be employed such as thermal oxidation, low pressure chemical vapor deposition (LPCVD), plasma enhanced chemical vapor deposition (PECVD), high density plasma chemical vapor deposition (HDPCVD), sputtering, or spin-on techniques to a thickness suitable for providing an interconnect layer. In one example, the first dielectric layer 102 formed is silicon dioxide type, such as TEOS or silane oxide by a CVD process. The first dielectric layer 102 is utilized as an inlay for subsequent superconductor lines used for connections to a resistor.

As illustrated in FIG. 3, a photoresist material layer 104 has been applied to cover the structure, and patterned and developed to expose openings 106 and 108 in the photoresist material layer 104 in accordance with a trench pattern. The photoresist material layer 104 can have a thickness that varies in correspondence with the wavelength of radiation used to pattern the photoresist material layer 104. The photoresist material layer 104 may be formed over the first dielectric layer 102 utilizing spin-coating or spin casting deposition techniques, selectively irradiated (e.g., with deep ultraviolet (DUV) irradiation), and developed to form the openings 106 and 108. The means of exposure for example could be deep ultraviolet (DUV) to create minimum feature sizes of approximately 250 nm.

FIG. 3 also illustrates performing of an etch 200 (e.g., anisotropic reactive ion etching (RIE)) on the first dielectric layer 102 to form extended openings 110 and 112 (FIG. 4) in the first dielectric layer 102 based on the pattern in the photoresist material layer 104. The etch 200 can be a dry etch and employ an etchant which selectively etches the first dielectric layer 102 at a faster rate than the overlying photoresist material layer 104. For example, the first dielectric layer 102 may be anisotropically etched with a plasma gas(es), herein carbon tetrafluoride ($CF_4$) containing fluorine ions, in a commercially available etcher, such as a parallel plate RIE apparatus or, alternatively, an electron cyclotron resonance (ECR) plasma reactor to replicate the mask pattern of the patterned photoresist material layer 104 and thereby create the extended trench openings 110 and 111. The photoresist material layer 104 is thereafter stripped (e.g., ashing in an $O_2$ plasma) and wet cleaned to remove organic residues, so as to result in the structure shown in FIG. 4.

Figure 4:
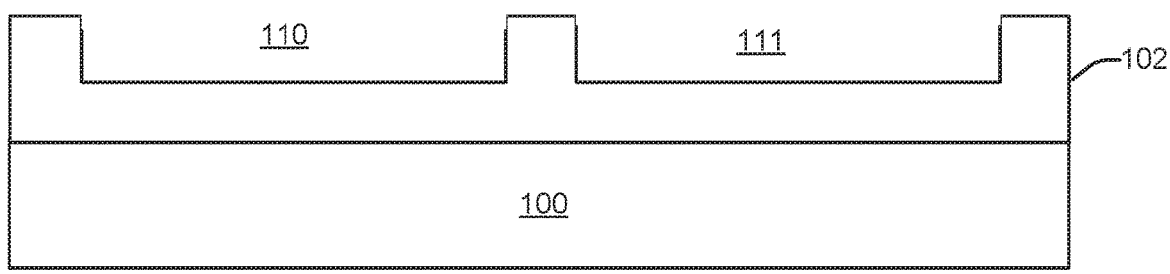
FIG. 4 illustrates a schematic cross-sectional view of the structure of FIG. 3 after the etch process and after the photoresist material layer has been stripped.
Figure 5:
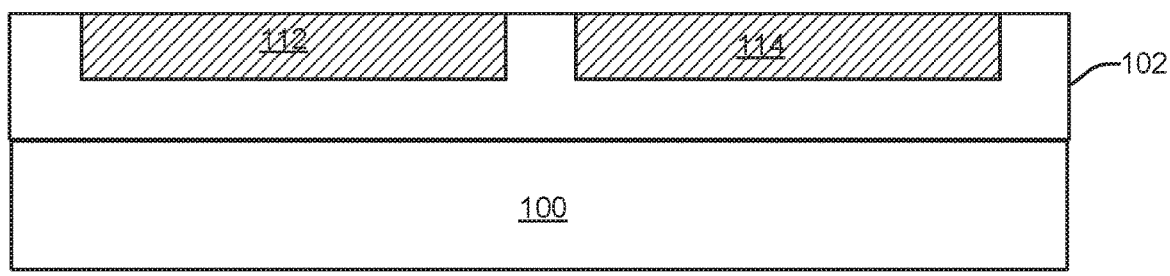
FIG. 5 illustrates a schematic cross-sectional view of the structure of FIG. 4 after a contact material fill.

Next, the structure of FIG. 4 undergoes a trench material fill to deposit a superconductor material, such as niobium, aluminum or tantalum, into the extended trench openings 110 and 111 to form the resultant structure shown in FIG. 5. The trench material fill can be deposited employing a standard trench material deposition such as physical vapor deposition (PVD), sputtering or evaporation with sufficient thickness to fill the trench openings 110 and 111. Following deposition of the trench material fill, the superconducting material is polished utilizing chemical mechanical polishing (CMP) down to the surface level of the first dielectric layer 102 to form a first superconductor line 112 and a second superconductor line 114, resulting in the structure of FIG. 5. The CMP can use a slurry which is selective to the first dielectric layer 102. The slurry used to polish the superconductor material can contains a peroxide component which will remove the superconductor selective to the dielectric material.

Figure 6:
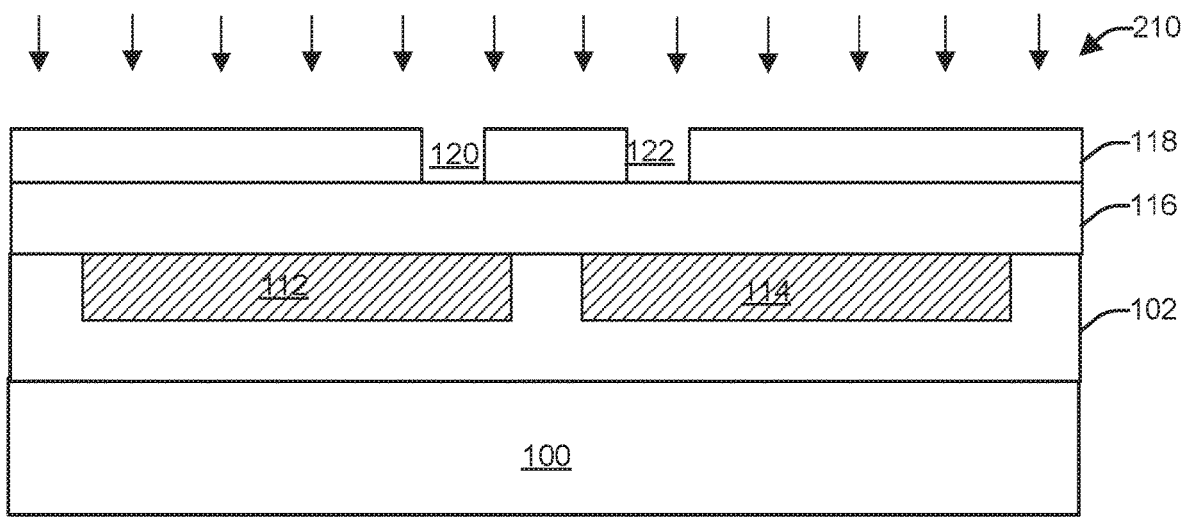
FIG. 6 illustrates a schematic cross-sectional view of the structure of FIG. 5, after deposition of a dielectric layer, after a photoresist material layer has been deposited and patterned over the dielectric layer, and while undergoing an etch process.

Next, a second dielectric layer 116, such as a thin layer of the silicon oxide film, is deposited on the surface of the structure of FIG. 5. A photoresist material layer 118 is deposited over the second dielectric layer 116 and patterned to form openings 120 and 122 over the second dielectric layer 116 to provide the resulatant structure of FIG. 6. FIG. 6 also illustrates performing of an etch 210 (e.g., anisotropic reactive ion etching (RIE)) on the second dielectric layer 116 to form extended openings 124 and 126 (FIG. 7) in the second dielectric layer 116 based on the pattern in the photoresist material layer 118. The etch 210 can be a dry etch similar to the etch 200 of FIG. 3, and employ an etchant which selectively etches the second dielectric layer 116 at a faster rate than the overlying photoresist material layer, and stop on the first superconductor line 112 and the second superconductor line 114 below. The photoresist material layer 116 is then stripped by an oxygen plasma as discussed above to provide the resultant structure of FIG. 7. The thickness of the second dielectric layer 116 should be be thick enough to prevent the subsequent resistor material from shorting to the first and second superconductor lines 112 and 114, but thin enough to minimize the subsequent topography.

Figure 7:
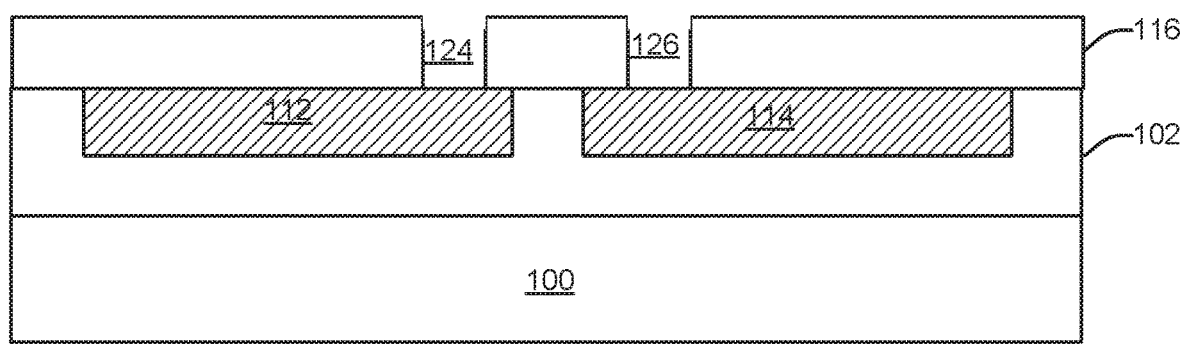
FIG. 7 illustrates a schematic cross-sectional view of the structure of FIG. 6 after the etch process and after the photoresist material layer has been stripped.
Figure 8:
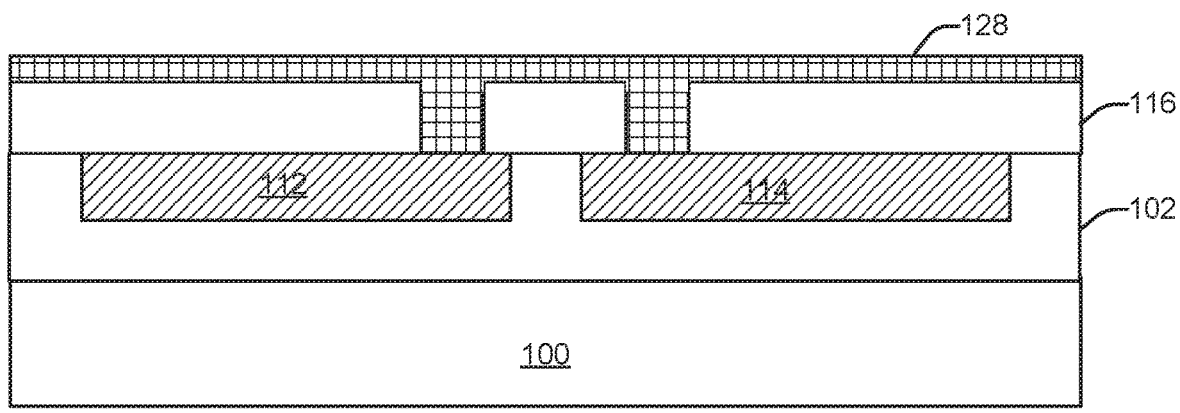
FIG. 8 illustrates a schematic cross-sectional view of the structure of FIG. 7 after deposition of a resistive material layer.

Next, a resistive material deposition is performed to deposit a resistive material layer 128, such as titanium tungsten (TiW), molybdenum or molybdenum nitride (Mo, MoN), or palladium gold (PdAu), over the structure of FIG. 7, resulting in the structure shown in FIG. 8. The resistive material 128 can be sputter deposited to fill the openings 124 and 126 to the correct thickness based on the resistor sheet resistivity requirements at the operating temperature of the device.

Figure 9:
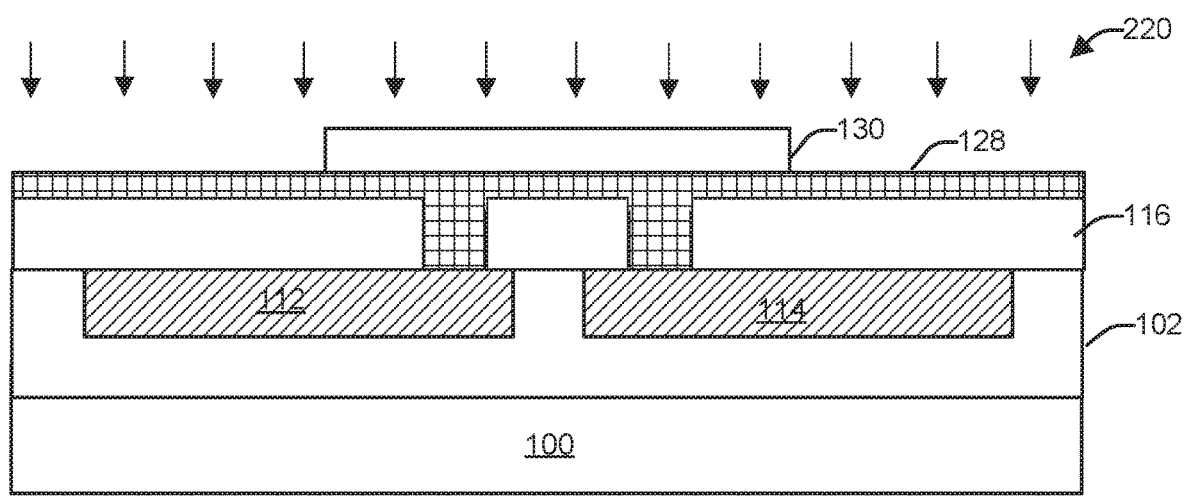
FIG. 9 illustrates a schematic cross-sectional view of the superconductor structure of FIG. 8 after a photoresist material layer has been deposited and patterned, and while undergoing an etch process.
Figure 10:
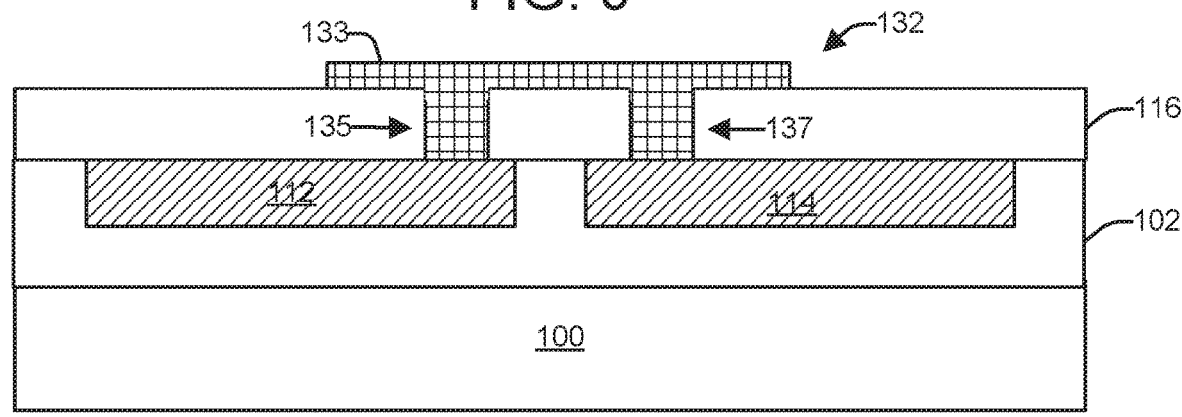
FIG. 10 illustrates a schematic cross-sectional view of the structure of FIG. 9 after the etch process and after the photoresist material layer has been stripped.

As illustrated in FIG. 9, a photoresist material layer 130 has been applied to cover the structure, and patterned and developed to form a protective area of the resistive material layer 128, exposing the remaining portions of the resistive material layer 128. FIG. 9 also illustrates performing of an etch 220 (e.g., anisotropic reactive ion etching (RIE)) on the resistive material layer 128 to remove portions of the resistive material not forming a resistor and to form a resistor 132 as illustrated in FIG. 10. The resultant resistor 132 includes a connector portion 133 overlying at least a portion of the second dielectric layer 116 coupled to a first resistor contact 135 and a second resistor contact 137. The etch 220 can be a metal etch with an etchant which selectively etches the underlying resistive conducting material at a faster rate than the overlying photoresist material layer 130. The photoresist material layer 130 is thereafter stripped (e.g., ashing in an $O_2$ plasma) so as to result in the structure shown in FIG. 10.

Figure 11:
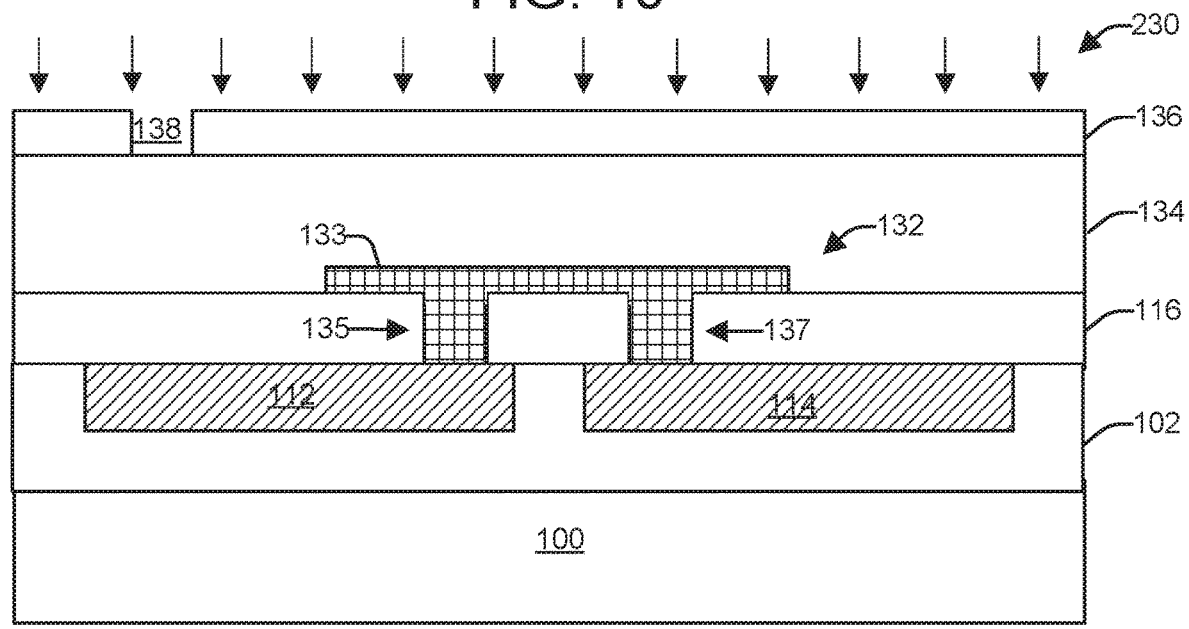
FIG. 11 illustrates a schematic cross-sectional view of the superconductor structure of FIG. 10 after undergoing deposition of a dielectric layer, after a first photoresist material layer has been deposited and patterned, and while undergoing an etch process.

A third dielectric layer 134 is then deposited over the structure FIG. 10 to form the structure of FIG. 11. The third dielectric layer 134 can be a thicker silicon dioxide material layer. Any suitable technique for forming the third dielectric layer 134 may be employed such as low pressure chemical vapor deposition (LPCVD), plasma enhanced chemical vapor deposition (PECVD), high density plasma chemical vapor Deposition (HDPCVD), sputtering, or spin-on techniques to a thickness suitable for providing the third dielectric layer 134.

As illustrated in FIG. 11, a photoresist material layer 136 has been applied to cover the structure, and patterned and developed to expose a via opening 138 in the photoresist material layer 136 in accordance with a via pattern. FIG. 11 also illustrates performing of an etch 230 (e.g., anisotropic reactive ion etching (RIE)) on the third dielectric layer 134 to form extended via opening 140 (FIG. 12) in the third dielectric layer 134 based on the via pattern in the photoresist material layer 136. The etch 230 can be a dry etch and employ an etchant which selectively etches the underlying third dielectric layer 134 and second dielectric layer 116 at a faster rate than the underlying first superconductor line 112 and the overlying photoresist material layer 136. The photoresist material layer 136 is thereafter stripped (e.g., ashing in an $O_2$ plasma), so as to result in the structure shown in FIG. 12.

Figure 12:
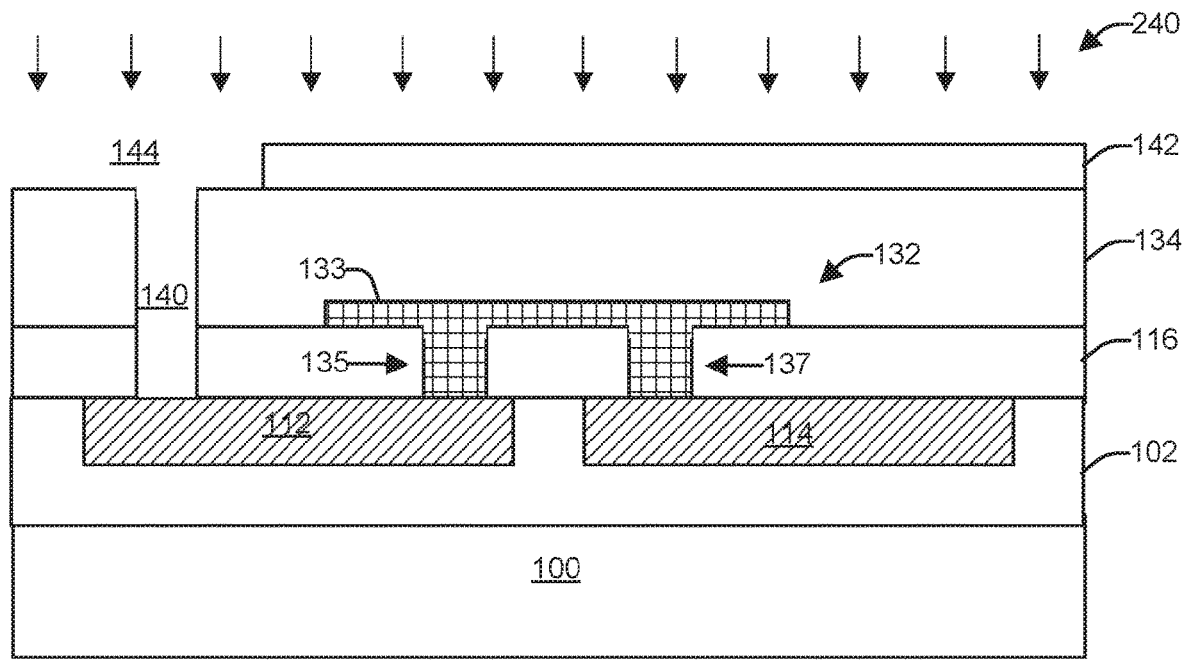
FIG. 12 illustrates a schematic cross-sectional view of the superconductor structure of FIG. 11, after stripping of the first photoresist material layer, after a second photoresist material layer has been deposited and patterned, and while undergoing an etch process.

As illustrated in FIG. 12, a photoresist material layer 142 has been applied to cover the structure, and patterned and developed to expose a trench opening 144 in the photoresist material layer 142 in accordance with a trench pattern. FIG. 12 also illustrates performing of an etch 240 (e.g., anisotropic reactive ion etching (RIE)) on the third dielectric layer 134 to form extended trench opening 146 (FIG. 13) in the third dielectric layer 134 based on the trench pattern in the photoresist material layer 142. The etch 240 can be a timed dry etch and employ an etchant which selectively etches the underlying third dielectric layer 134 at a faster rate than the underlying first superconductor line 112 and the overlying photoresist material layer 142. The photoresist material layer 142 is thereafter stripped (e.g., ashing in an $O_2$ plasma), so as to result in the structure shown in FIG. 13.

Figure 13:
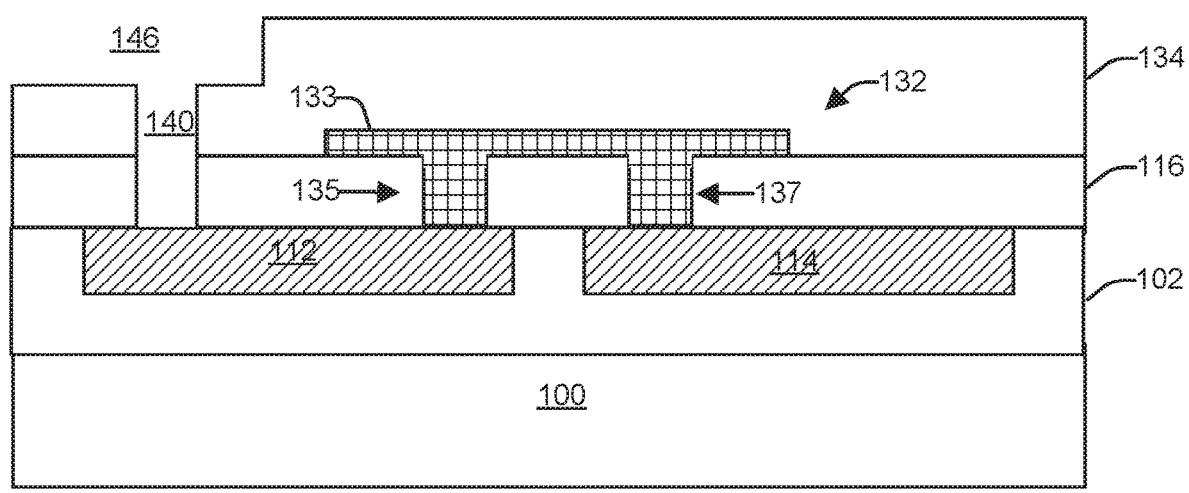
FIG. 13 illustrates a schematic cross-sectional view of the structure of FIG. 12 after the etch process and after the second photoresist material layer has been stripped.
Figure 14:
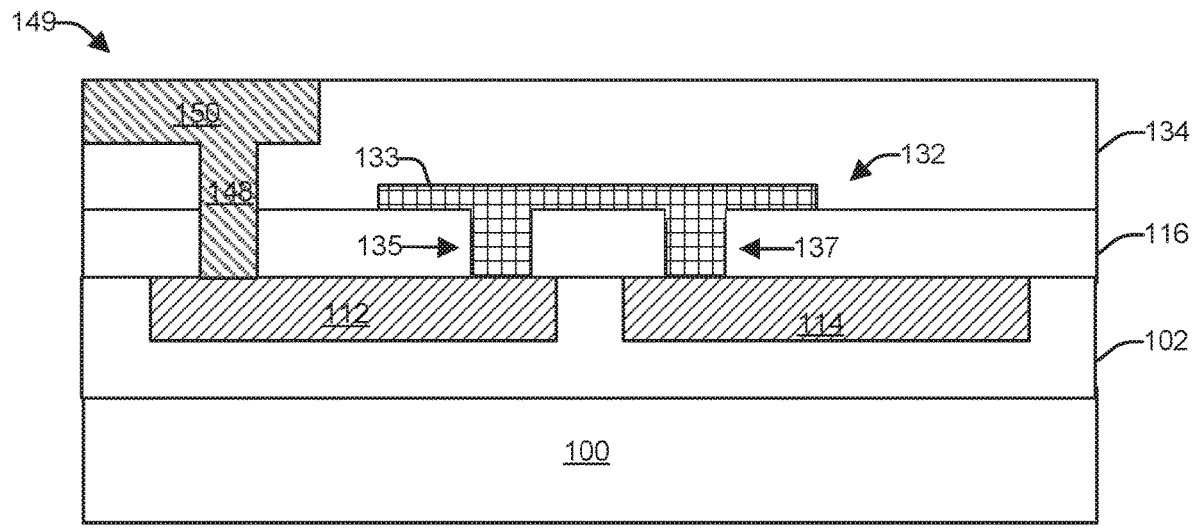
FIG. 14 illustrates a schematic cross-sectional view of the structure of FIG. 13 after a contact material fill process.

Next, the structure of FIG. 13 undergoes a contact material fill to deposit a superconductor material, such as niobium, aluminum or tantalum, into the extended via opening 140 and the extended trench opening 146 to provide a damascene superconductor connector 149 to the underlying first superconductor line 112 and form the resultant structure shown in FIG. 14. The contact material fill can be deposited employing a contact material deposition such as Physical Vapor Deposition (PVD), sputtering or evaporation to fill the via opening 140 and trench opening 146 with a superconductor material. Following deposition of the contact material fill, the superconducting material is polished utilizing chemical mechanical polishing (CMP) down to the surface level of the third dielectric layer 134 to form the resulting structure of FIG. 14. The damascene superconductor connector 149 includes a superconductor contact 148 connected to the first superconductor line 112, and a superconductor line 150.

Figure 15:
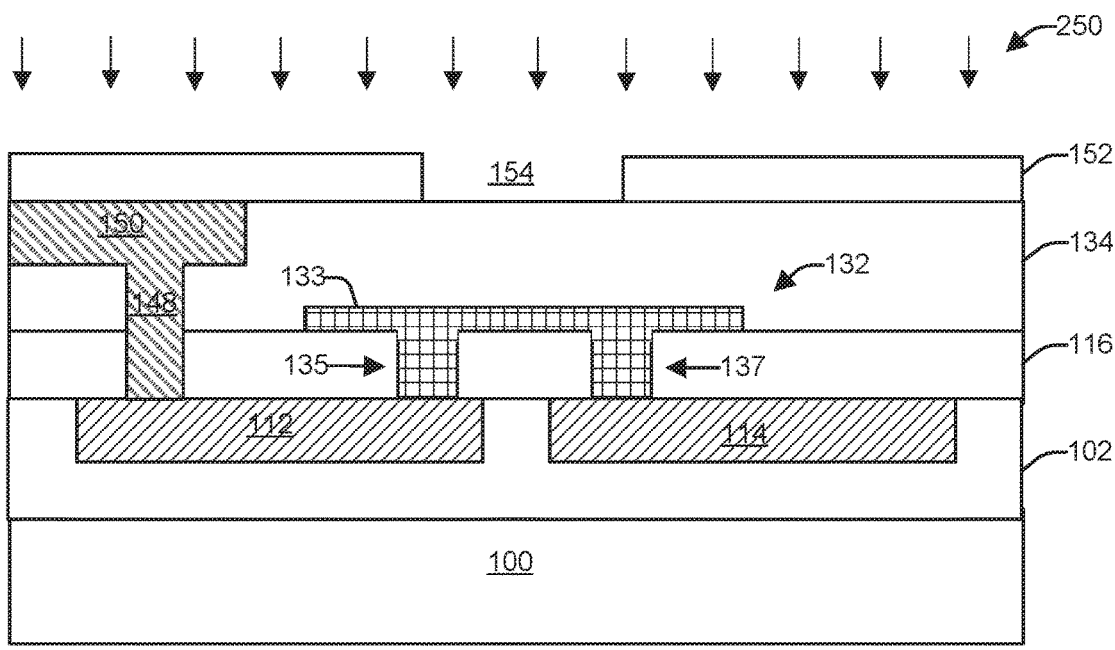
FIG. 15 illustrates a schematic cross-sectional view of the superconductor structure of FIG. 14 after a photoresist material layer has been deposited and patterned, and while undergoing an etch process.
Figure 16:
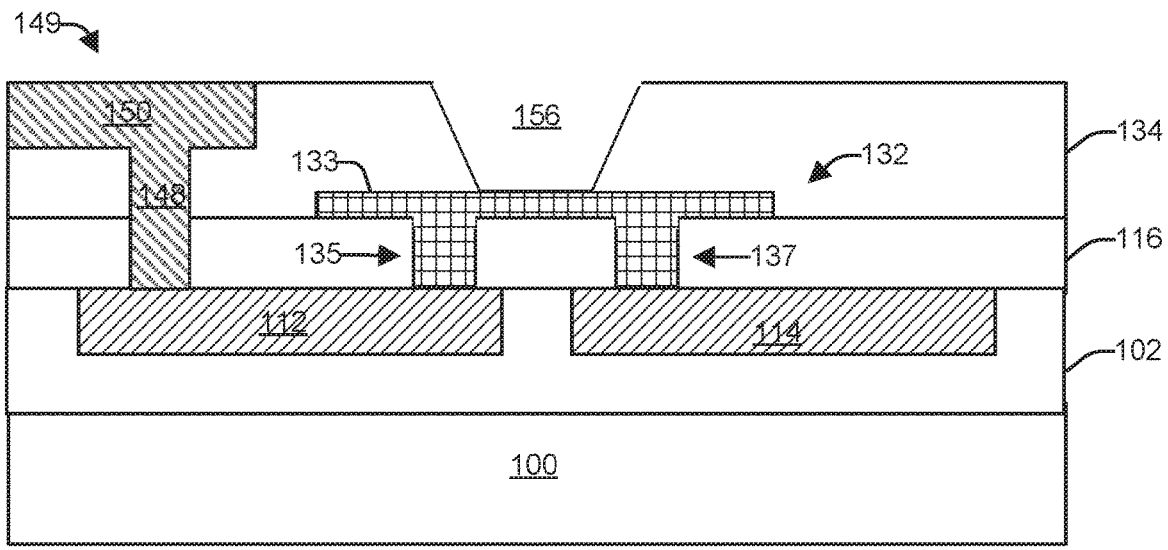
FIG. 16 illustrates a schematic cross-sectional view of the structure of FIG. 15 after the etch process and after the photoresist material layer has been stripped.

As illustrated in FIG. 15, a photoresist material layer 152 has been applied to cover the structure of FIG. 14, and patterned and developed to expose a via opening 154 in the photoresist material layer 152 in accordance with a via pattern with the via opening 154 disposed above a middle portion of the resistor 132. FIG. 15 also illustrates performing of a top via plasma etch 250 on the third dielectric layer 134 to form tapered opening 156 (FIG. 16) in the third dielectric layer 134 based on the via pattern in the photoresist material layer 152. The top via plasma etch 250 is tailored to be isotropic to form a large taper of the sidewall, so subsequent deposition of a normal metal is adequate to ensure electrical contact to the resistor 132. This can be about a 50° to about a 60° angle. The photoresist material layer 152 is thereafter stripped (e.g., ashing in an $O_2$ plasma), so as to result in the structure shown in FIG. 16.

Figure 17:
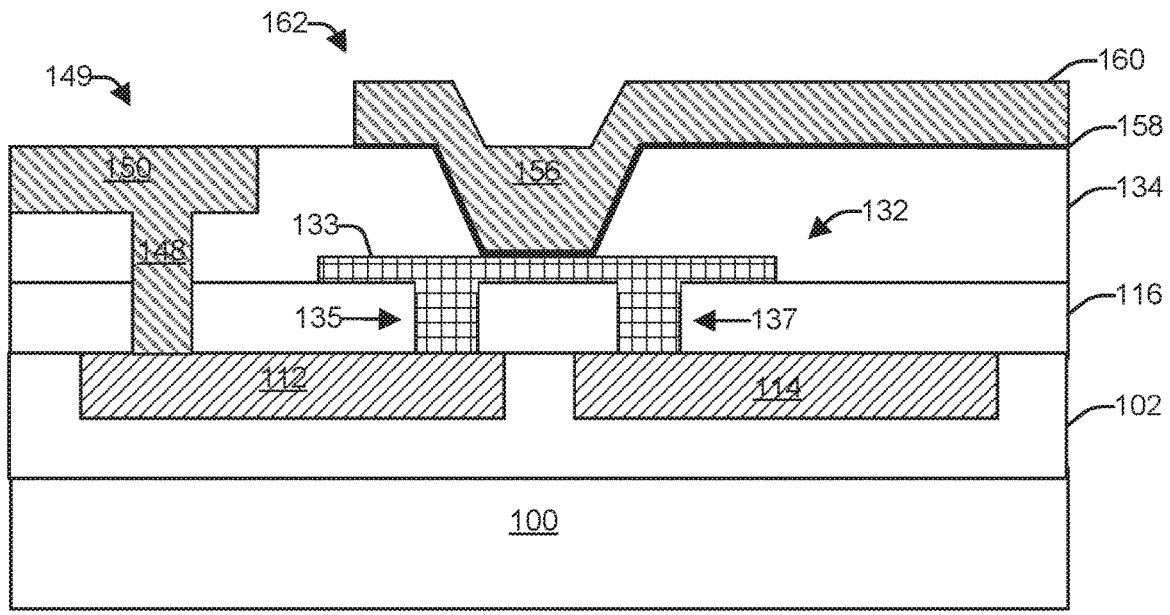
FIG. 17 illustrates a schematic cross-sectional view of the structure of FIG. 16 after deposition of a liner and after a contact material fill process.

After the photoresist material layer strip of the top via pattern, another photoresist pattern (not shown) is created to enable a lift-off profile for subsequent deposition of normal metal. The normal metal is deposited in an evaporation system using first an Ar pre-clean to remove any oxidized TiW followed by deposition of a thin titanium (Ti) layer 158 and a thick normal metal 160, such as gold. The thin Ti layer 158 is used to scavenge residual oxide to enable a good ohmic contact between the gold and the TiW. A thick gold film is used because it has low resistivity and does not superconduct. The gold wire pattern is realized after the lift-off and removal of the photoresist pattern to provide the resultant structure of FIG. 17. FIG. 17 illustrates a normal metal connector 162 that overlies a portion of the third dielectric layer 134 and fills the tapered opening 156 in the third dielectric layer 134 to connect with a mid-portion of the resistor 132. The normal metal connector 162 can be configured to provide a third connection to the resistor 132 to provide an electrical connection and/or remove heat from the resistor 132.

For purposes of simplification of explanation the terms "overlay", "overlaying", "overlying", "underlay" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation are for purposes of illustration. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A method of forming a superconductor structure, the method comprising:
    forming a superconductor line in a first dielectric layer;
    forming a second dielectric layer overlying the first dielectric layer, the second dielectric layer having at least one opening formed therein;
    forming a resistor with an end coupled to an end of the superconductor line through the at least one opening and a connecting portion connecting to the end of the resistor;
    forming a third dielectric layer overlying the second dielectric layer and the resistor, the connecting portion of the resistor residing in the third dielectric layer;
    etching a tapered opening through the third dielectric layer to the resistor; and
    performing a contact material fill with a normal metal material to fill the tapered opening and form a normal metal connector coupled to the resistor.

2. The method of claim 1, wherein the normal metal connector is coupled to a mid-portion of the resistor.

3. The method of claim 1, wherein the superconductor line is a first superconductor line, and further comprising a second superconductor line disposed in the first dielectric layer spaced apart from the first superconductor line.

4. The method of claim 3, wherein the resistor has a first resistor contact coupled to the first superconductor line and a second resistor contact coupled to the second superconductor line, and wherein the connecting portion connecting the first resistor contact to the second resistor contact.

5. The method of claim 4, wherein the connecting portion extends past both the first resistor contact and the second resistor contact and provides a substantial portion of the resistance value of the resistor.

6. The method of claim 1, further comprising forming a superconductor contact that is in contact with an end of the superconductor line opposite an end of the superconductor line that is coupled to the resistor.

7. The method of claim 6, further comprising forming another superconductor line in contact with the superconductor contact to form a damascene superconductor connector, the another superconductor line having a surface that is planar with a top surface of third dielectric layer.

8. The method of claim 1, wherein the normal metal connector is coupled to an end-portion of the resistor.

9. The method of claim 1, wherein the resistor is formed from one of titanium tungsten (TiW), molybdenum or molybdenum nitride (Mo, MoN), or palladium gold (PdAu) and the superconductor line is formed from one of niobium, aluminum and tantalum.

10. The method of claim 1, further comprising depositing a liner material to fill the tapered opening and extend over a portion of the third dielectric layer, and wherein the performing a contact material fill with a normal metal material comprises depositing a normal metal material over the liner material within the tapered opening and extending over the portion of the third dielectric layer, such that the liner material and the normal metal material collectively form the normal metal connector.

11. The method of claim 10, wherein the liner material is formed of titanium and the normal metal is formed of gold.

12. A superconductor structure comprising:
    a first dielectric layer overlying a substrate;
    a superconductor line residing within the first dielectric layer;
    a second dielectric layer overlying the first dielectric layer;
    a third dielectric layer overlying the second dielectric layer;
    a resistor with a resistor contact end extending through the second dielectric layer to an end of the superconductor line, and a connecting portion connecting to the resistor contact end and residing within the third dielectric layer;
    a tapered opening through the third dielectric layer to the resistor; and
    a normal metal connector that connects to the resistor through the tapered opening.

13. The superconductor structure of claim 12, wherein the normal metal connector is coupled to a mid-portion of the resistor.

14. The superconductor structure of claim 12, wherein the superconductor line is a first superconductor line, and further comprising a second superconductor line disposed within the first dielectric layer spaced apart from the first superconductor line.

15. The superconductor structure of claim 14, wherein the resistor contact is a first resistor contact and further comprising a second resistor contact extends through the second dielectric layer and is coupled to the second superconductor line, and wherein the connecting portion connects the first resistor contact to the second resistor contact.

16. The superconductor structure of claim 15, wherein the connecting portion extends past both the first resistor contact and the second resistor contact and provides a substantial portion of the resistance value of the resistor.

17. The superconductor structure of claim 16, further comprising a damascene superconductor connector that includes another superconductor line in contact with a superconductor contact that connects to the superconductor line, the another superconductor line having a surface that is planar with a top surface of the third dielectric layer.

18. The superconductor structure of claim 12, wherein the normal metal connector is coupled to an end-portion of the resistor.

19. The superconductor structure of claim 12, wherein the resistor is formed from one of titanium tungsten (TiW), molybdenum or molybdenum nitride (Mo, MoN), or palladium gold (PdAu) and the superconductor line is formed from one of niobium, aluminum and tantalum.

20. The superconductor structure of claim 12, further comprising a liner material that fills the tapered opening and extends over a portion of the third dielectric layer, and a normal metal material disposed over the liner material within the tapered opening and extending over the portion of the third dielectric layer, such that the liner material and the normal metal material collectively form the normal metal connector.

* * * * *